United States Patent
Paton et al.

(10) Patent No.: US 7,091,097 B1
(45) Date of Patent: Aug. 15, 2006

(54) END-OF-RANGE DEFECT MINIMIZATION IN SEMICONDUCTOR DEVICE

(75) Inventors: Eric N. Paton, Morgan Hill, CA (US); Qi Xiang, San Jose, CA (US); Cyrus E. Tabery, Santa Clara, CA (US); Bin Yu, Cupertino, CA (US); Robert B. Ogle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/933,424

(22) Filed: Sep. 3, 2004

(51) Int. Cl.
*H01L 21/336* (2006.01)

(52) U.S. Cl. .................. 438/303; 438/305; 438/306; 438/487; 257/346; 257/408

(58) Field of Classification Search ............. 438/303, 438/308, 487
See application file for complete search history.

(56) References Cited

U.S. PATENT DOCUMENTS

| | | | |
|---|---|---|---|
| 6,555,439 B1* | 4/2003 | Xiang et al. | 438/305 |
| 6,680,250 B1* | 1/2004 | Paton et al. | 438/660 |
| 6,936,505 B1* | 8/2005 | Keys et al. | 438/166 |
| 2005/0003638 A1* | 1/2005 | Stolk | 438/482 |

* cited by examiner

*Primary Examiner*—Trung Dang

(57) ABSTRACT

A method of fabricating a semiconductor device comprises forming a gate electrode over a substrate and forming deep amorphous regions within the substrate. And implanting dopants to form deep source/drain regions at a depth less than that of the deep amorphous regions, partially re-crystallizing portions of the deep amorphous regions to reduce their depth, and re-crystallizing the reduced amorphous regions to form activated final source/drain regions.

22 Claims, 8 Drawing Sheets

END-OF-RANGE DEFECT MINIMIZATION IN SEMICONDUCTOR DEVICE

FIELD OF THE INVENTION

The present invention relates to the field of semiconductor device processing and manufacture, and more specifically, to minimizing end-of-range defects and junction leakage.

BACKGROUND OF THE INVENTION

A typical metal-oxide-semiconductor (MOS) device generally includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall into one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as SiO2. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

As the dimensions of the MOSFET shrinks, the reduction in effective gate length requires a proportional scaling in the vertical junction depth of the source/drain regions. The reduction in the junction depth of the source/drain regions is to reduce short channel effects.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping creates an amorphitizes the silicon substrate, and the activation annealing is used to recrystallize the amorphitized silicon region.

A problem associated with source/drain regions is the formation of "end-of-range defects," which are believed to stem from an interstitial-rich region proximate the lower portion of an amorphous silicon region. These interstitial-rich regions are formed during doping of the source/drain regions. Referring to FIG. 1, an amorphous silicon region 35 is formed during the doping of a silicon substrate 10 to form source/drain regions 31. The amorphous silicon region 35 has a lower portion characterized by an interstitial-rich region 33. After the activation anneal and upon recrystallization of surface amorphous region 35, interstitials in the interstitial-rich region 33 are believed to agglomerate, thereby generating end-of-range defects 60, such as dislocations and stacking faults, bordering the lower portion of the source/drain regions 31. When these end-of-range defects 60 are present in the source/drain regions 31, the defects disadvantageously cause junction leakage. Accordingly, a need exists for a process that minimizes the effects of end-of-range defects in the source/drain regions.

SUMMARY OF THE INVENTION

The present invention provides for fabricating a semiconductor device that leaves end-of-range defects substantially deeper within the substrate than the junctions of the device's active source/drain regions. As a result, junction leakage is substantially reduced. The fabrication can take the form of any of a variety of methods. Within a particular method, the order of some of the method steps can differ. However, in each method multiple amorphous regions are formed, with at least one amorphous region being more shallow than a prior formed amorphous region. And re-crystallization occurs within the shallower amorphous region.

A common first step among these methods is forming a gate electrode over a substrate. Subsequently, a method in accordance with the present invention comprises forming deep amorphous regions by pre-amorphisization implantation (PAI). The method further comprises forming deep source/drain regions by implanting dopants within the substrate at a depth less than the depth of the deep amorphous regions. Either before or after the implantation, the method comprises forming shallower, intermediate amorphous regions by partially re-crystallizing portions of the deep amorphous regions. The depth of the partially re-crystallized regions is chosen to be less than the depth of the deep amorphous regions, but at least as deep, if not deeper, than the depth of the deep source/drain regions. The final source/drain regions are formed by re-crystallizing the intermediate amorphous regions. Re-crystallizing melts the intermediate amorphous regions, thereby distributing the dopants throughout the re-crystallized regions—even if the dopants were more shallowly implanted. Re-crystallizing also activates the dopants.

By partially re-crystallizing only shallower portions of the deep amorphous regions, a buffer is formed between the shallower, intermediate amorphous regions and the end-of-range defects located beyond the periphery of the original deep amorphous regions. The dopants are deeply implanted within the intermediate amorphous regions, and not beyond.

High dose laser thermal annealing (LTA), for example, may be used to selectively melt to a depth not greater than that of the intermediate amorphous regions, to preserve the buffer region. The depth of the melt, therefore, will be at least as deep as the deep source/drain implants, but not greater than that of the intermediate amorphous regions. The source/drain junctions will be located at the depth of the melt. Consequently, the buffer is maintained between the junctions of the final source/drain regions and the end-of-range defects. Because the end-of-range defects are located away from the source/drain junctions, junction leakage as a result of the end-of-range defects is significantly reduced.

In other embodiments of the invention, a semiconductor device may be formed by a method comprising the steps of forming a precursor with a gate electrode and sidewall spacers on a substrate and source/drain extensions in the substrate. Then, a pre-amorphisization implantation into the substrate creates amorphous regions having a first depth. A source/drain implantation of dopants is then made into the substrate at a depth less than the first depth. Either before or after the source/drain implantations, portions of the amorphous regions are reduced to an intermediate, second depth by soak annealing. The second depth is less than the first depth, but not less than the depth of the deep source/drain regions. The reduced amorphous regions are then re-crystallized and the dopants activated by LTA.

Additional advantages of the present invention will become readily apparent to those skilled in this art from the following detailed description, wherein only the preferred embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

The present invention addresses and solves, at least in part, the problem of junction leakage as a result of end-of-range defects at the junctions of the source/drain regions of a semiconductor device. Various embodiments of the present invention may take the form of a method for fabricating a semiconductor device that leaves the end-of-range defects significantly deeper than the junctions of the active source/drain regions. The region between the end-of-range defects and active source/drain regions may be referred to as a "buffer". The depths of various regions or layers provided herein are illustrative, and not meant to be restrictive. It is the relative depths of the regions and layers discussed herein that is significant.

In any of the various inventive methods, a gate electrode may be formed on a substrate, as is customary. Such methods also comprise forming deep amorphous silicon regions by pre-amorphitization implantation (PAI) within the substrate. Source/drain regions are formed by implanting dopants into the substrate at a depth that is shallower than the depth of the deep amorphous regions. Either before or after the deep source/drain implantation, portions of the deep amorphous regions are partially re-crystallized using solid phase epitaxy (SPE) by, for example, low dose LTA, or low temperature soak anneals in a furnace or lamp system. The depth of the SPE regions are shallower than that of the depth of the deep amorphous regions, but preferably greater than that of the deep source/drain regions. Since the partially re-crystallized amorphous regions are shallower than the deep amorphous regions, the end-of-range defects remain separated from the junctions by a buffer region.

Laser thermal annealing is applied, which melts and re-crystallizes the intermediate amorphous regions, as well as activating the dopants therein, forming final source/drain regions. The final source/drain junction depth is determined by the thickness of the final amorphous regions—and the end-of-range defects are located significantly deeper than the junctions. Because the end-of-range defects are located in the region beyond the depth of the original deep amorphous regions, the defects are not located in or near the activated source/drain regions, thereby reducing or eliminating junction leakage as a result of the end-of-range defects.

Figure 1:
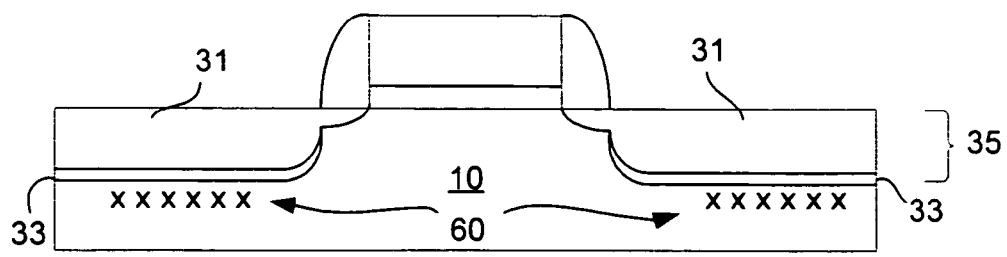
FIG. 1 schematically illustrates end-of-range defects in a prior art device.
Figure 2A:
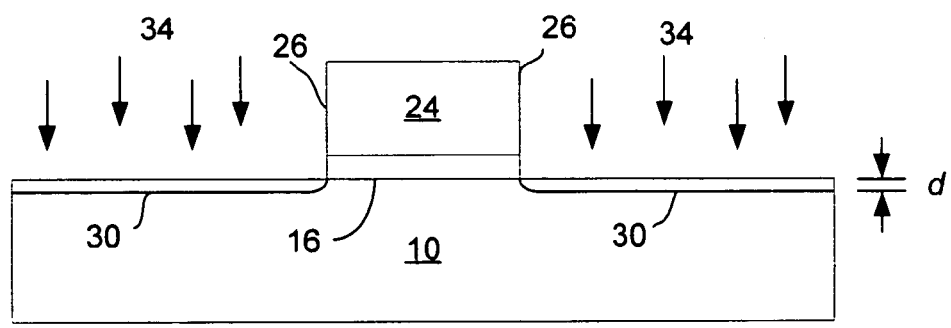
FIG. 2A through FIG. 2D schematically illustrate sequential phases of a MOS fabrication method to mitigate junction leakage due to end-of-range defects, using a laser thermal annealing process in conjunction with solid phase epitaxy according to an embodiment of the present invention.
Figure 2B:
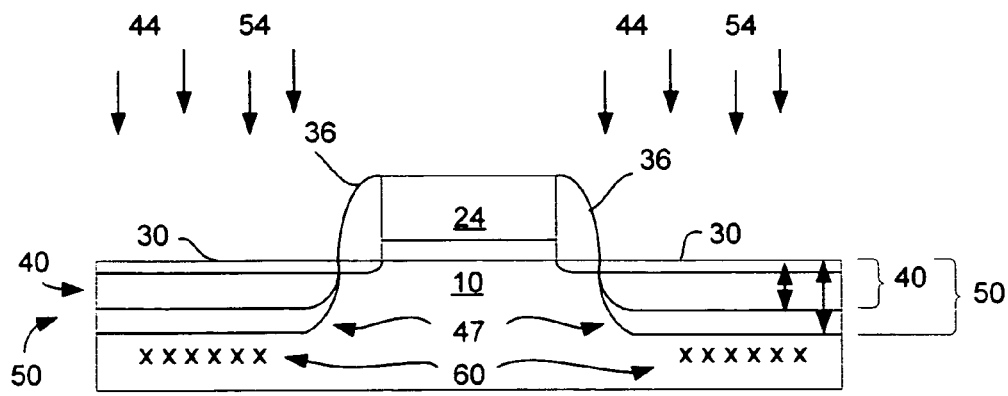
Figure 2C:
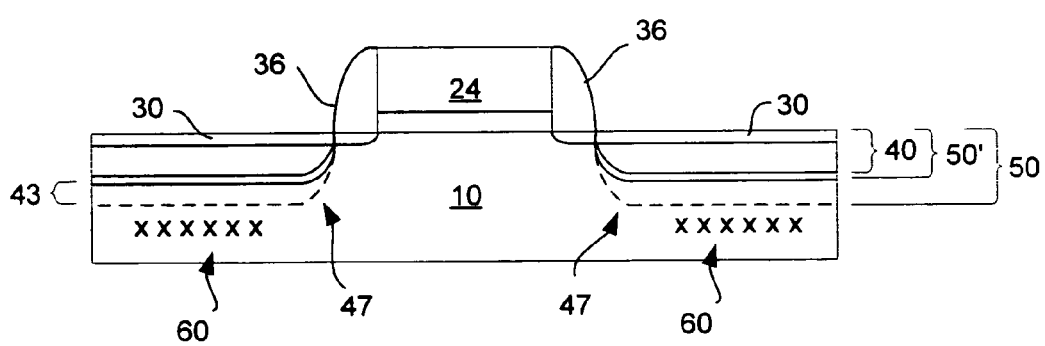
Figure 2D:
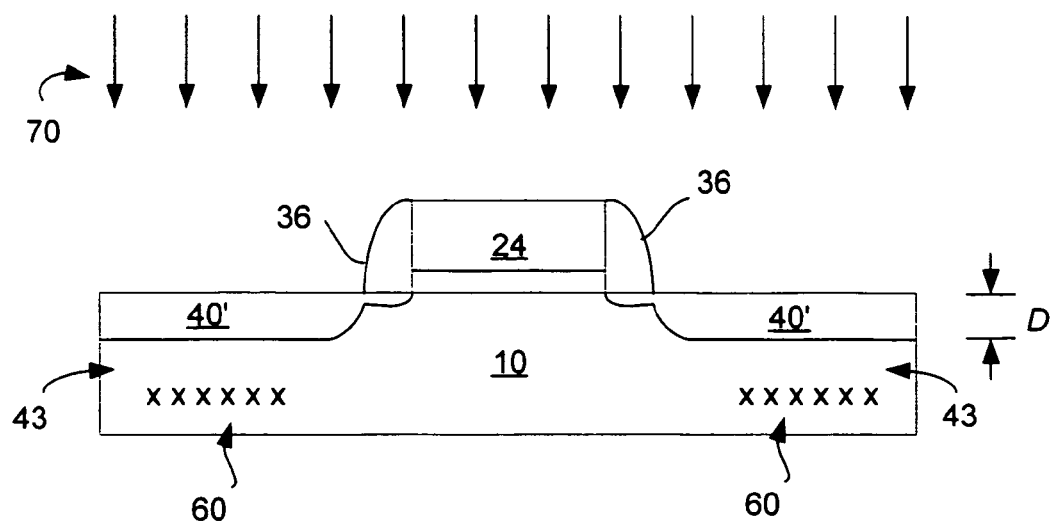
Figure 3A:
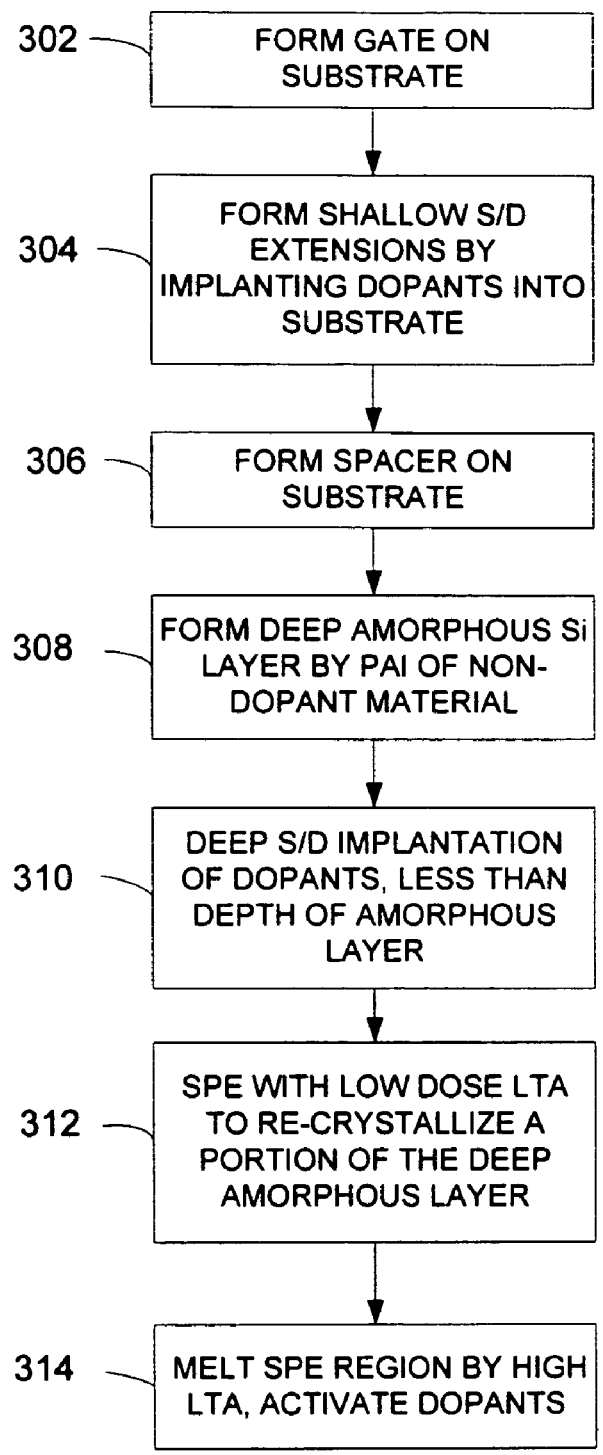
FIG. 3A provides a method of fabricating the device of FIG. 2A through FIG. 2D.

FIGS. 2A–2D depict stages of producing a semiconductor device according to the method of FIG. 3A. A conventionally formed precursor is depicted in FIG. 2A, where a gate electrode 24 has been formed on a substrate 10, as shown in step 302 of FIG. 3A. The stage depicted in FIG. 2A is a post-etching stage—etching was used to form the gate electrode 24 with sidewalls 26. The gate electrode 24 may be formed of polysilicon, for example, on a gate oxide 16. Dopants 34 are implanted within substrate 10 to form shallow source/drain extensions 30 having a depth d and adjacent to the gate electrode, shown in step 304. The gate electrode 24 serves as a barrier to dopant implantation into the substrate 10, beneath the gate electrode. The depth of the source/drain extensions may be those typically used in the art; an exemplary depth d may be between about 100–200 angstroms. Doping concentrations and implantation energies are well-known for creating shallow source/drain extensions, so not discussed in detail herein.

In FIG. 2B, and step 306, sidewall spacers 36 are formed following the implantation of the source/drain extensions 30. Formation of the sidewall spacers 36 preferably involves blanket depositing a spacer material over the substrate 10.

The spacer material can be silicon nitride or some other material such as plasma-enhanced oxide (PEOX) or tetra-ethoxysilane derived (TEOS) oxide, as examples. Still other materials may be employed, such as silicon oxynitride, low k materials, or similar materials known in the art. The blanket deposition is followed by an anisotropic etch, which removes the spacer material except for the sidewall spacers 36 immediately adjacent to the sidewalls 26 of the gate electrode 24 and over the substrate 10.

After formation of the sidewall spacers 36 deep amorphous silicon regions 50 are formed in substrate 10 by pre-amorphitization implantation (PAI), as shown in step 308. As is shown in FIG. 2B, the end-of-range defects 60 lie beyond the boundary 47 of the deep amorphous silicon regions 50. The PAI uses a non-dopant material, such as silicon (Si), represented by arrows 54. As an example, the deep amorphous regions 50 may be selectively formed to a depth of about 600 angstroms and beyond. The depth of the deep amorphous regions 50 is a function of the implantation energies employed in the PAI. Exemplary ranges of energies for various types of substrate materials or "species" is: (1) 30 keV to 80 keV using Xe, (2) 12 keV to 28 keV using Si, or (3) 22 keV to 48 keV using Ge. A typical dose for any species is about $1 \times 10^{15}$ atoms/cm$^2$.

Following step 308 of FIG. 3A, either step 310 or step 312 may be performed. Each needs to be conducted, but the order of the two is not critical. In step 310, deep source/drain regions are formed by a second ion implantation, as represented by arrows 44. The deep source/drain regions 40 are formed within the substrate 10 with the sidewall spacers 36 acting as masks that protect the substrate 10 immediately adjacent the gate electrode 24 from being deeply doped. The depth of the source/drain regions 40 is less than the depth of the deep amorphous regions 50. For example, depending on the depth of the deep amorphous regions 50, the depth of the deep source/drain regions can be from about 200 to about 400 angstroms. Preferably the deep amorphous regions are at least about 200 angstroms deeper than the deep source/drain regions. Lesser differences in depth could be used, but the risk of junction leakage increases accordingly. As examples, the deep source/drain implantation can be achieved by employing dopant energies between about 500 eV and about 3 keV for B11, and 2 keV to 15 keV for Arsenic and BF2.

Either before or after step 310 is performed, step 312 is performed. In step 312, and as depicted in FIG. 2C, portions of the amorphous regions 50 are partially re-crystallized to form intermediate amorphous regions 50'. Formation of the intermediate amorphous regions 50' may be accomplished using solid phase epitaxy (SPE) by low dose laser thermal annealing (LTA) or by low temperature soak anneals in a furnace or lamp system, as examples. The regions are not melted and fully re-crystallized, as would be the case at higher energies or temperatures. Rather, each of these approaches re-grows the amorphous regions leaving the end-of-range defects 60 beyond the boundary of the deep amorphous regions 50.

As an example, low dose LTA of an SOI (silicon on insulator) substrate would could be accomplished with a multi-pulse YAG laser having energy below about 0.18 J/cm$^2$, which is the energy needed to melt an SOI substrate, at a wavelength of about 532 nm. The temperature of the low temperature soak anneals may be in the range of about 550° C. to 700° C. and applied for a period of as much as about 15 minutes to as little as about 3 minutes, depending on the temperature. This is typically performed in a tube furnace. In a lamp furnace, with the same approximate temperature range, the duration would typically be about 50 seconds to 2 minutes, as will be appreciated by those skilled in the art.

The depth of the intermediate amorphous regions 50' is chosen to be less than that of the deep amorphous regions 50, but at least as much as that of the deep source/drain regions 40. Preferably, the depth of the deep amorphous regions 50 are at least 150 angstroms greater than that of the intermediate amorphous regions 50'. Consequently, the end-of-range defects 60 remain significantly deeper than the shallower intermediate amorphous regions 50'. And buffer regions 43 are formed between the intermediate amorphous regions 50' and boundary 47 of the deep amorphous regions 50. As an example, if the depth of the amorphous regions was 800 angstroms and the depth of the source/drain regions was 400 angstroms, then the intermediate amorphous regions may be chosen to be about 600 angstroms deep.

In FIG. 2D, and as depicted in step 314 of FIG. 3A, a high dose LTA, for example, is performed having sufficient energy to melt and re-crystallize the intermediate amorphous silicon regions 50'. This high dose LTA causes the dopants within the source/drain extensions 30 and the deep source/drain regions 40 to be distributed throughout the melted intermediate amorphous silicon regions 50'. Therefore, even if the deep source/drain regions 40 were more shallow than the intermediate amorphous regions 50', the distribution of the dopants caused by the LTA melting of step 314 extends the final source/drain regions 40' to the depth of the melt D. The LTA also activate the dopants. As a result, the final, activated source/drain regions 40' become the re-crystallized regions and the portions of the source drain extensions beneath the spacers 36. And the buffer regions 43 are maintained between the junctions of the final source/drain regions 40' and the end-of-range defects 60. The thickness of the buffer regions 43 is not limited as to a particular amount provided that the thickness is sufficient to separate the end-of-range defects from the final source/drain regions 40' so as to reduce junction leakage caused by the end-of-range defects.

Energy from a laser used for the LTA to liquefy the substrate 10 to the desired depth is represented by arrows 70 in FIG. 2D. An example of a laser capable of providing this energy is a spatially homogenized 308 nm XeCl pulsed laser. Although the invention is not limited in this manner, and the energy and power of the laser can vary in accordance with different applications and several variations are known in the art.

After the silicon in source/drain regions 40' has been melted, which takes approximately 30–100 nanoseconds, the silicon cools rapidly, within about one microsecond, and the silicon reforms epitaxially. In so doing, damage caused by the implant process is removed. The energy fluence of the laser at the surface determines the melt duration that occurs at the surface, and melt duration is related to maximum melt depth. The relationship between melt duration and maximum melt depth depends on the temporal profile of the laser beam. Precise control of junction or melt depth is possible due to the capability of measuring the full width height maximum (FWHM) of the laser and the surface melt duration during the process. Relatively large changes in the energy fluence are required to create small changes in the maximum melt depth. The total melt time can be varied by varying the number and/or energy of the laser pulses. For example, a fluence range of approximately 750 mJ/cm$^2$ to 1.3 J/cm$^2$ results in junction depths ranging from 200 angstroms to 1500 angstroms from a 308 nm excimer laser at a 9 Hz repetition rate.

The fluence range for laser irradiation can extend from about 50 mJ/cm² to about 1.3 J/cm². However, the fluence of the laser can be advantageously controlled to melt only to a depth that the silicon has been amorphitized because amorphous silicon absorbs energy at a higher rate than crystalline silicon. For example, a fluence of about 400 mJ/cm² can be used to melt amorphous silicon and not melt crystalline silicon, which in this instance is the re-crystallized silicon in the buffer regions 43. FIG. 2D shows a resulting semiconductor device in accordance with the present invention.

Figure 3B:
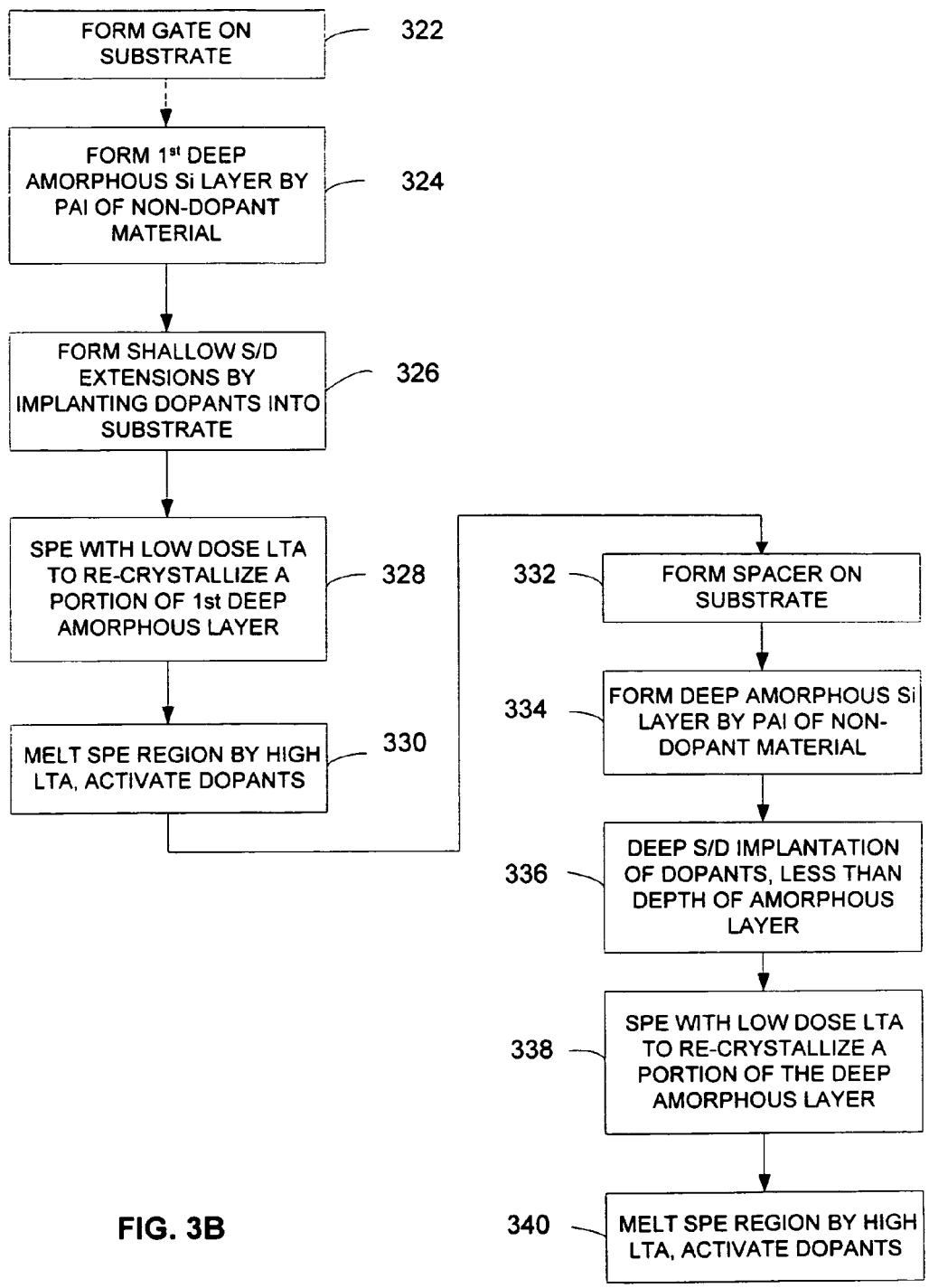
FIG. 3B provides a method of fabricating the device of FIG. 4A and FIG. 4B.
Figure 4A:
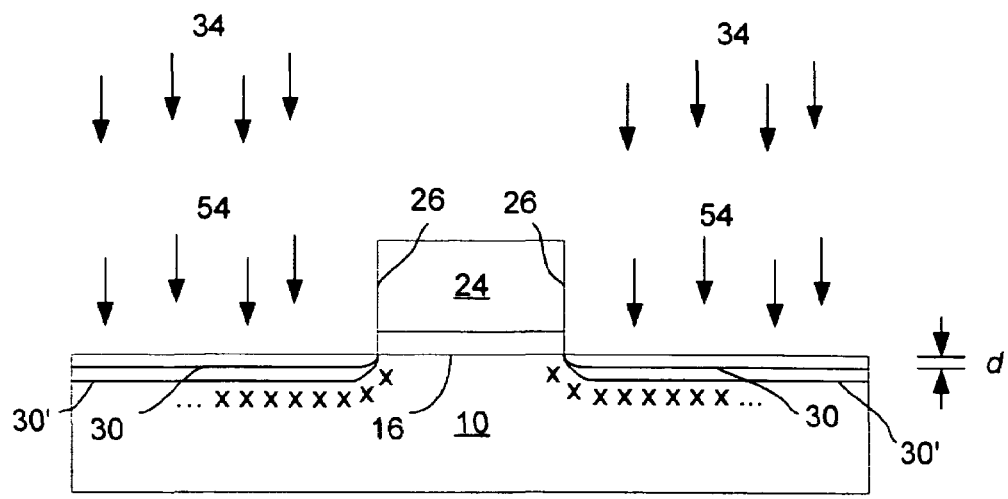
FIG. 4A schematically illustrates a device with source/drain extensions according to an embodiment of the invention.
Figure 4B:
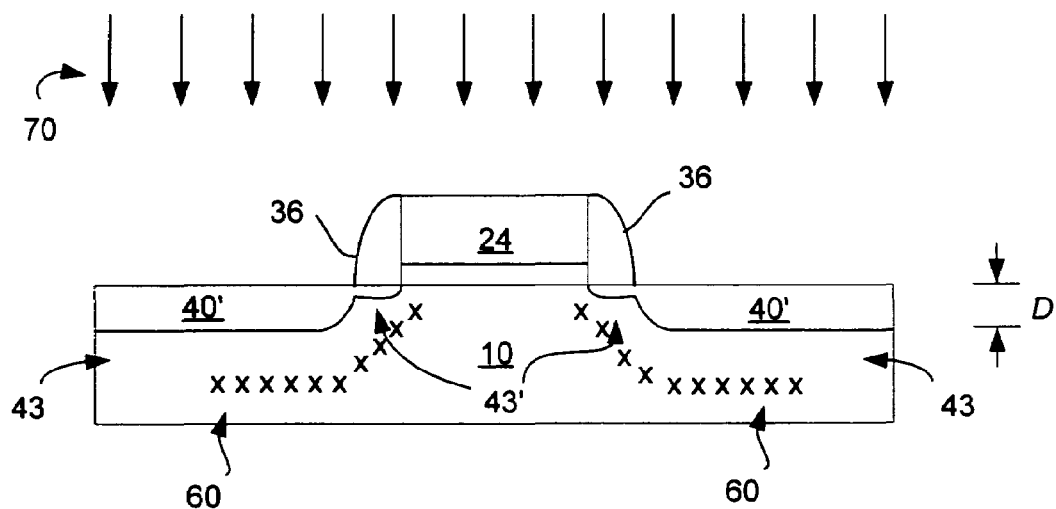
FIG. 4B schematically illustrates a device with active source/drain regions according to an embodiment of the invention.

FIG. 3B depicts yet another method for producing a semiconductor device in accordance with the present invention. Step 322 provides the formation of the gate electrode 24 over the substrate 10. Unlike the method of FIG. 3A, the source/drain extensions are formed using multi-step LTA. A first relatively deep amorphization is performed in step 324 by PAI, prior to forming spacers. In step 326 the source/drain extension regions are formed by implantation of dopants. Either prior to or after step 326, portions of the first deep amorphitization layer are partially re-crystallized using SPE by low-dose LTA, in step 328. And, in step 330, the SPE regions are re-crystallized using high-dose LTA, which distributes the dopants within the re-crystallized regions and activates them. The result is source/drain extensions 30 of the device of FIG. 4A having a depth d. Source/drain extensions 30 are similar to those of the device of FIG. 2A, but with some buffer 43' (see FIG. 4B) for the end-of-range defects associated with the source/drain extensions.

Following formation of the spacers 36, steps 334 through 340 repeat the steps 308 through 314 of the method of FIG. 3A. The result is the device of FIG. 4B, with final active source/drain regions 40' being substantially similar to those of FIG. 2D, and having a depth D.

Figure 3C:
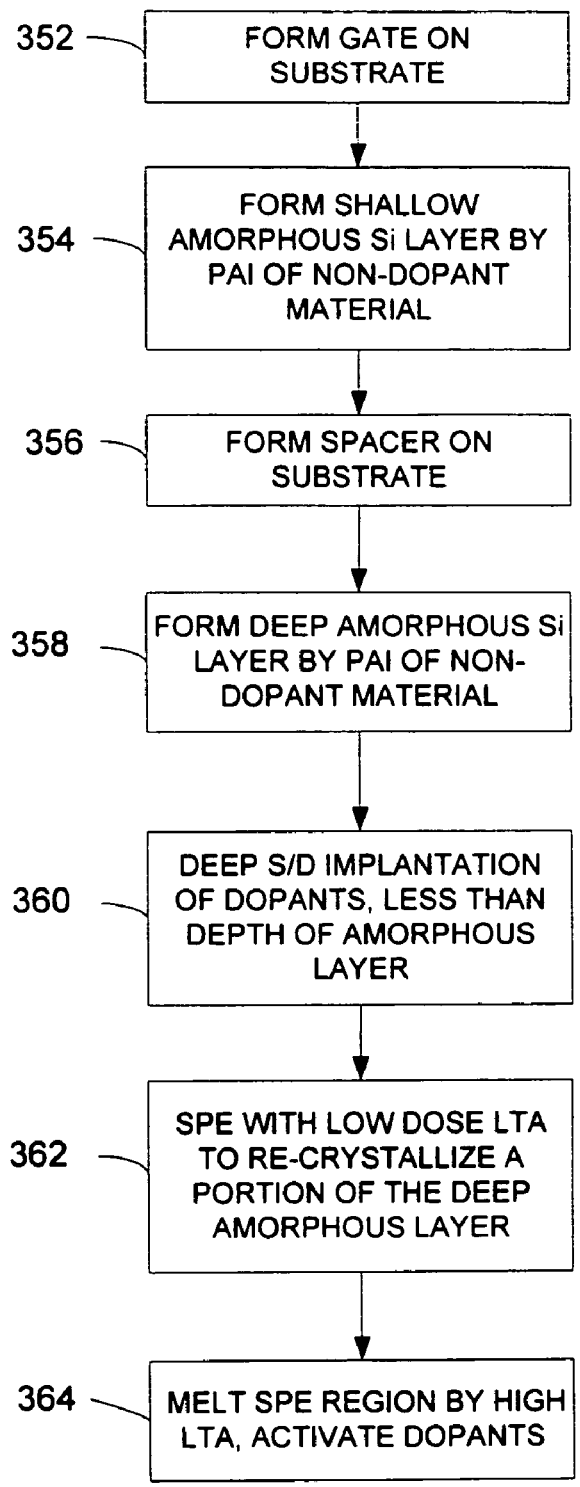
FIG. 3C provides a method of fabricating the device of FIGS. 5A and 5B.
Figure 5A:
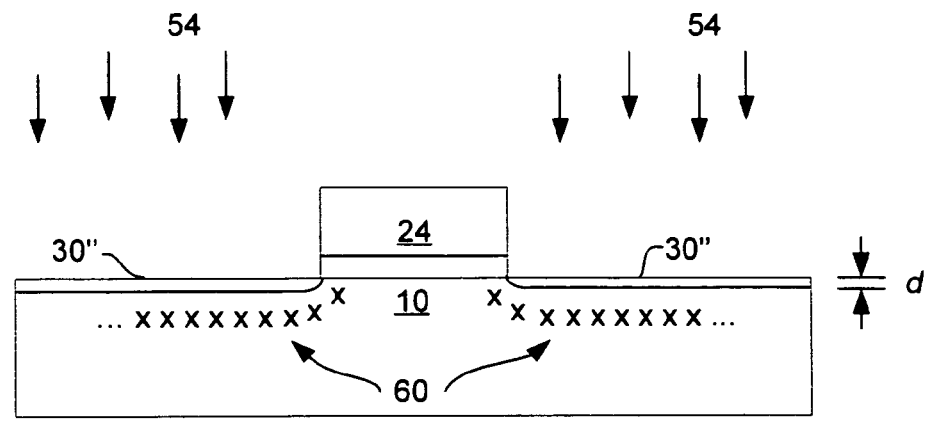
FIG. 5A schematically illustrates a device with source/drain extensions according to an embodiment of the invention.

FIG. 3C depicts yet another method for producing a semiconductor device in accordance with the present invention. Step 352 provides the formation of the gate electrode 24 over the substrate 10. Prior to formation of spacers, shallow amorphous regions 30" are formed by PAI of a non-dopant material, represented by arrows 54, in step 354. The shallow amorphous regions 30" have a depth d similar to that of the source drain extensions 30 of FIGS. 2A–2D, as is shown in FIG. 5A. In step 356 the spacers 36 are formed, in the manner described above.

Figure 5B:
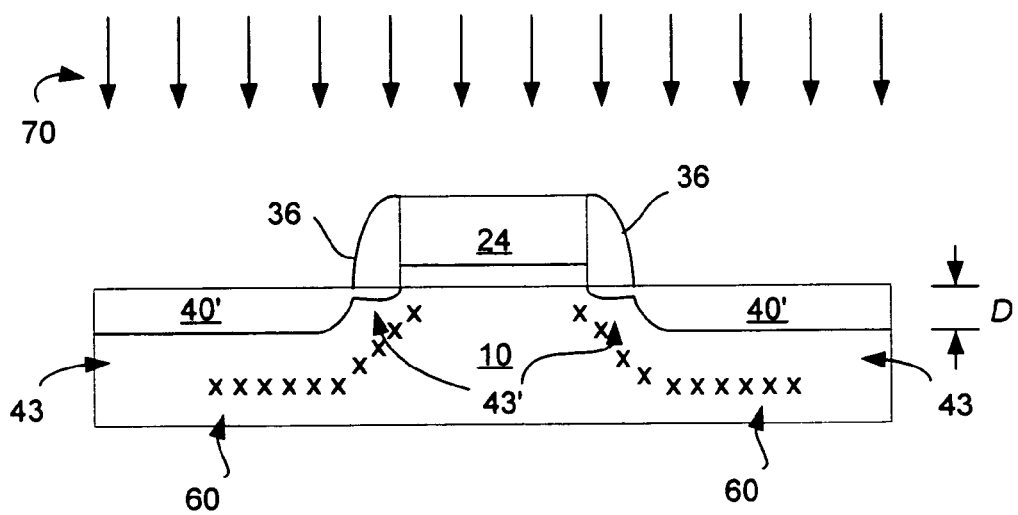
FIG. 5B schematically illustrates a device with active source/drain regions according to an embodiment of the invention.

Following formation of the spacers 36, steps 358 through 364 repeat the steps 308 through 314 of the method of FIG. 3A. Note that the shallow amorphous regions 30" were not independently doped. However, the deep source/drain implantation of dopants in step 360 is sufficient. With the LTA of step 364 there is lateral diffusion of the dopants during the re-crystallization that causes the shallow amorphous source/drain regions beneath the spacers 36 to also become activated portions of the final source/drain regions 40', which as a depth D. Similarly, buffer 43' is formed below the source/drain extensions. The result is the device of FIG. 5B.

Only the preferred embodiment of the present invention and but a few examples of its versatility invention are shown and described in the present disclosure. It is to be understood that the present invention is capable of use in various other combinations and environments and is capable of changes or modifications within the scope of the inventive concepts as expressed herein.

What is claimed is:

1. A method of fabricating a semiconductor device having reduced junction leakage, the method comprising the steps of:
   A. forming a gate electrode over a substrate;
   B. forming deep amorphous regions to a first depth by pre-amorphisization implantation;
   C. implanting dopants within the deep amorphous regions to form amorphisized source/drain regions to a second depth, which is less than the first depth;
   D. forming intermediate amorphous regions by partially recrystallizing portions of the deep amorphous regions to a third depth, which is less than the first depth, but at least as deep as the second depth; and
   E. recrystallizing the intermediate amorphous regions and activating the dopants to form final source/drain regions to a depth about equal to the third depth such that deep amorphous regions are located beneath the final source/drain regions and the final source/drain regions comprise activated dopants throughout the final source/drain regions.

2. The method of claim 1, wherein the recrystallizing of step E comprises high dose laser thermal annealing.

3. The method of claim 1, wherein the partially recrystallizing of step D comprises using solid phase epitaxy.

4. The method of claim 3, wherein the solid phase epitaxy is by low dose laser thermal annealing or by low temperature soak annealing.

5. The method of claim 1, wherein the forming deep amorphous regions of step B comprises implanting neutral ions into the substrate.

6. The method of claim 1, wherein the difference between the first depth and the third depth is at least about 150 angstroms.

7. The method of claim 1, wherein step D is accomplished prior to step C.

8. A method of fabricating a semiconductor device having reduced junction leakage, the method comprising the step of:
   A. forming a gate electrode over a substrate;
   B. forming source/drain extensions in the substrate to a depth d;
   C. forming spacers adjacent to the gate electrode that mask portions of the source/drain extensions proximate to the gate electrode;
   D. forming amorphous regions to a depth D1 by pre-amorphisization implantation of exposed portions of the source/drain extensions, where D1>d;
   E. implanting dopants within the amorphous regions to form amorphisized source/drain regions to a depth D2, where d<D2<D1;
   F. forming intermediate amorphous regions by partially recrystallizing portions of the amorphous regions to a depth D3, where D2<D3<D1; and
   G. recrystallizing the intermediate amorphous regions and activating the dopants to form final source/drain regions at a depth D, which is about equal to D3 such that deep amorphous regions are located beneath the final source/drain regions and the final source/drain regions comprise activated dopants throughout the final source/drain regions.

9. The method of claim 8, wherein step B comprises:
   B.1 forming amorphous source/drain extension regions to a depth d1 by pre-amorphisization implantation, where d1>d;
   B.2 implanting dopants within the amorphous source/drain extension regions to form amorphisized source/drain regions to a depth d2, where d2<d1;

B.3 forming intermediate amorphous source/drain extension regions by partially recrystallizing portions of the amorphous source/drain extension regions to a depth d3, where $d2 \leq d3 < d1$; and B.4 recrystallizing the intermediate amorphous source/drain extension regions and activating the dopants to form final source/drain extension to the depth d, which is about equal to d3.

10. The method of claim 8, wherein the difference between the D1 and D is at least about 150 angstroms.

11. The method of claim 8, wherein the partially recrystallizing of step F comprises using solid phase epitaxy by low dose laser thermal annealing or by low temperature soak annealing.

12. The method of claim 8, wherein the recrystallizing of step G comprises high dose later thermal annealing.

13. A method of fabricating a semiconductor device having reduced junction leakage, the method comprising the steps of:
   A. forming a gate electrode over a substrate;
   B. forming amorphous source/drain extension regions in the substrate to a depth d1 by pre-amorphisization implantation;
   C. forming spacers adjacent to the gate electrode that mask portions of the amorphous source/drain extension regions proximate to the gate electrode;
   D. forming amorphous regions to a depth D1 by pre-amorphisization implantation of exposed portions of the source/drain extensions, where $D1 > d1$;
   E. implanting dopants within the amorphous regions to form amorphisized source/drain regions to a depth D2, where $d1 < D2 < D1$;
   F. forming intermediate amorphous regions by partially recrystallizing portions of the amorphous regions to a depth D3, where $D2 < D3 < D1$; and
   G. recrystallizing the intermediate amorphous regions and source/drain extension regions and activating the dopants to form final source/drain regions at a depth d in the source/drain extension regions beneath the spacers and a depth D in the intermediate amorphous regions, where d is about equal to d1 and D is about equal to D3 such that deep amorphous regions are located beneath the final source/drain regions and the final source/drain regions comprise activated dopants throughout the final source/drain regions.

14. The method of claim 13, wherein the difference between the D1 and D is at least about 150 angstroms.

15. The method of claim 13, wherein the partially recrystallizing of step F comprises using solid phase epitaxy by low dose laser thermal annealing or by low temperature soak annealing.

16. The method of claim 13, wherein the recrystallizing of step G comprises high dose laser thermal annealing.

17. A semiconductor device having reduced junction leakage formed by a process comprising the steps of:
   A. forming a gate electrode disposed on a substrate;
   B. forming deep amorphous regions to a first depth by pre-amorphisization implantation;
   C. implanting dopants within the deep amorphous regions to form amorphisized source/drain regions to a second depth, which is less than the first depth;
   D. forming intermediate amorphous regions by partially recrystallizing portions of the deep amorphous regions to a third depth, which is less than the first depth, but at least as deep as the second depth; and
   E. recrystallizing the intermediate amorphous regions and activating the dopants to form final source/drain regions to a depth about equal to the third depth such that deep amorphous regions are located beneath the final source/drain regions and the final source/drain regions comprise activated dopants throughout the final source/drain regions.

18. A semiconductor device having reduced junction leakage formed by a process comprising the steps of:
   A. forming a gate electrode over a substrate;
   B. forming source/drain extension in the substrate to a depth d;
   C. forming spacers adjacent to the gate electrode that mask portions of the source/drain extensions proximate to the gate electrode;
   D. forming amorphous regions to a depth D1 by pre-amorphisization implantation of exposed portions of the source/drain extensions, where $D1 > d$;
   E. implanting dopants within the amorphous regions to form amorphisized source/drain regions to a depth D2, where $d < D2 < D1$;
   F. forming intermediate amorphous regions by partially recrystallizing portions of the amorphous regions to a depth D3, where $D2 \leq D3 < D1$; and
   G. recrystallizing the intermediate amorphous regions and activating the dopants to form final source/drain regions at a depth D, which is about equal to D3 such that deep amorphous regions are located beneath the final source/drain regions and the final source/drain regions comprise activated dopants throughout the final source/drain regions.

19. The device of claim 18, wherein step B comprises:
   B.1 forming amorphous source/drain extension regions to a depth d1 by pre-amorphisization implantation, where $d1 > d$;
   B.2 implanting dopants within the amorphous source/drain extension regions to form amorphisized source/drain regions to a depth d2, where $d2 < d1$;
   B.3 forming intermediate amorphous source/drain extension regions by partially recrystallizing portions of the amorphous source/drain extension region to a depth d3, where $d2 \leq d3 < d1$; and
   B.4 recrystallizing the intermediate amorphous source/drain extension regions and activating the dopants to form final source/drain extensions to the depth d, which is about equal to d3.

20. A semiconductor device having reduced junction leakage formed by a process comprising the step of:
   A. forming a gate electrode over a substrate;
   B. forming amorphous source/drain extension regions in the substrate to a depth d1 by pre-amorphous implantation;
   C. forming spacers adjacent to the gate electrode that mask portions of the amorphous source/drain extensions regions proximate to the gate electrode;
   D. forming amorphous regions to a depth D1 by pre-amorphisization implantation of exposed portions of the source/drain extensions, where $D1 > d1$;
   E. implanting dopants within the amorphous regions to form amorphisized source/drain regions to a depth D2, where $d1 < D2 < D1$;
   F. forming intermediate amorphous regions by partially recrystallizing portions of the amorphous regions to a depth D3, where $D2 < D3 < D1$; and
   G. recrystallizing the intermediate amorphous regions and source/drain extension regions and activating the dopants to form final source/drain regions at a depth d in the source/drain extension regions beneath the spacers and a depth D in the intermediate amorphous regions, where d is about equal to d1 and D is about equal to D3 such that deep amorphous regions are located beneath the final source/drain regions and the final source/drain regions comprise activated dopants throughout the final source/drain regions.

21. A semiconductor device having reduced junction leakage, the semiconductor device comprising:
   A. a gate electrode disposed on a substrate;
   B. source/drain extensions formed within the substrate to a depth d and substantially adjacent to the gate electrode;
   C. spacers formed on the substrate and adjacent to the gate electrode and configured to mask portions of the source/drain extension regions proximate to the gate electrode;
   D. deep amorphous regions formed in the substrate to a depth D1, where d<D1; and
   E. final source/drain regions comprising the source/drain extensions beneath the spacers and intermediate source/drain regions formed within the substrate to a depth D, where d<D<D1, and further comprising activated dopants distributed throughout the final source/drain regions.

22. The device of claim 21, wherein the difference between the D1 and D is about at least 150 angstroms.

* * * * *